(12) United States Patent
Kim et al.

(10) Patent No.: US 11,404,729 B2
(45) Date of Patent: Aug. 2, 2022

(54) ELECTRONIC APPARATUS AND CHARGING CONTROL METHOD OF THE ELECTRONIC APPARATUS

(71) Applicant: LG ELECTRONICS INC., Seoul (KR)

(72) Inventors: Seungyon Kim, Seoul (KR); Gihong Lim, Seoul (KR); Jeongwoo Kim, Seoul (KR); Seokmin Hong, Seoul (KR); Heejoon Moon, Seoul (KR); Hyeyeong Kang, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 186 days.

(21) Appl. No.: 16/749,475

(22) Filed: Jan. 22, 2020

(65) Prior Publication Data

US 2021/0143490 A1     May 13, 2021

(30) Foreign Application Priority Data

Nov. 11, 2019   (WO) ................ PCT/KR2019/015287

(51) Int. Cl.
     *H01M 10/44*      (2006.01)
     *H01M 10/48*      (2006.01)
     (Continued)

(52) U.S. Cl.
     CPC ........ *H01M 10/443* (2013.01); *G01R 31/392* (2019.01); *H01M 10/425* (2013.01);
     (Continued)

(58) Field of Classification Search
CPC ............ H01M 10/443; H01M 10/486; H01M 10/425; H01M 2010/4278; H01M 2010/4271; H01M 10/48; H02J 7/007194; H02J 2310/22; H02J 7/00714; H02J 7/0071; H02J 7/00309; G01R 31/392; Y02B 40/00; Y02E 60/10
See application file for complete search history.

(56) References Cited

U.S. PATENT DOCUMENTS 5,633,573 A * 5/1997 van Phuoc ........... G01R 31/396
                                                                                   320/128
5,635,820 A * 6/1997 Park .................. H02J 7/007194
                                                                                   320/148

(Continued)

FOREIGN PATENT DOCUMENTS

JP        2003-87991 A     3/2003
JP        2012-115004 A    6/2012
(Continued)

*Primary Examiner* — Stacy Whitmore
(74) *Attorney, Agent, or Firm* — Birch, Stewart, Kolasch & Birch, LLP

(57) ABSTRACT

An electronic apparatus including a battery; a charging module; at least one sensor configured to sense a temperature of the battery; and a controller configured to control the charging module not to charge the battery when the sensed temperature is outside a predetermined temperature range, and when the sensed temperature is within the predetermined temperature range, control the charging module to charge the battery according to a set end of charge (EoC) current value of the battery.

15 Claims, 8 Drawing Sheets

(51) Int. Cl.
  *H01M 10/42* (2006.01)
  *H02J 7/00* (2006.01)
  *G01R 31/392* (2019.01)

(52) U.S. Cl.
  CPC ..... *H01M 10/486* (2013.01); *H02J 7/007194* (2020.01); *H01M 2010/4271* (2013.01); *H01M 2010/4278* (2013.01)

(56) References Cited

U.S. PATENT DOCUMENTS

| | | | | |
|---|---|---|---|---|
| 8,988,045 | B2* | 3/2015 | Klein | H01M 10/443 320/127 |
| 11,061,076 | B1* | 7/2021 | Fasching | G01R 31/367 |
| 2004/0066171 | A1* | 4/2004 | Mori | G06F 1/263 320/132 |
| 2008/0315845 | A1* | 12/2008 | Van Der Velden | H02J 7/008 320/162 |
| 2009/0309547 | A1* | 12/2009 | Nakatsuji | H01M 10/441 320/134 |
| 2010/0033138 | A1* | 2/2010 | Alger | H02J 7/007194 320/153 |
| 2012/0212184 | A1* | 8/2012 | Klein | H02J 7/0091 320/134 |
| 2014/0081585 | A1* | 3/2014 | Cappucino | H01M 10/44 702/65 |
| 2017/0028868 | A1* | 2/2017 | Minamiura | B60W 20/15 |
| 2017/0106760 | A1* | 4/2017 | Wang | B60L 53/00 |
| 2017/0207637 | A1* | 7/2017 | Sugeno | H02J 7/0048 |
| 2018/0123369 | A1* | 5/2018 | Pourdarvish | H02J 7/00 |
| 2018/0269512 | A1* | 9/2018 | Dong | H01M 50/77 |
| 2018/0375346 | A1* | 12/2018 | Wolfgang | H02J 9/06 |
| 2019/0084435 | A1* | 3/2019 | Grace | H01M 10/482 |
| 2020/0088805 | A1* | 3/2020 | Cha | G01R 31/36 |
| 2020/0110134 | A1* | 4/2020 | Li | G01R 31/374 |
| 2020/0150185 | A1* | 5/2020 | Ramezan Pour Safaei | H01M 10/425 |
| 2021/0096189 | A1* | 4/2021 | Arima | G01R 31/3842 |
| 2021/0143490 | A1* | 5/2021 | Kim | H01M 10/425 |
| 2021/0152012 | A1* | 5/2021 | Ha | H02J 7/00714 |
| 2021/0242449 | A1* | 8/2021 | Deiters | H01M 50/474 |
| 2021/0265627 | A1* | 8/2021 | Hiratsuka | H01M 4/364 |

FOREIGN PATENT DOCUMENTS

| | | |
|---|---|---|
| KR | 10-2001-0043673 A | 5/2001 |
| KR | 10-2011-0132977 A | 12/2011 |
| KR | 10-2019-0026424 A | 3/2019 |

\* cited by examiner

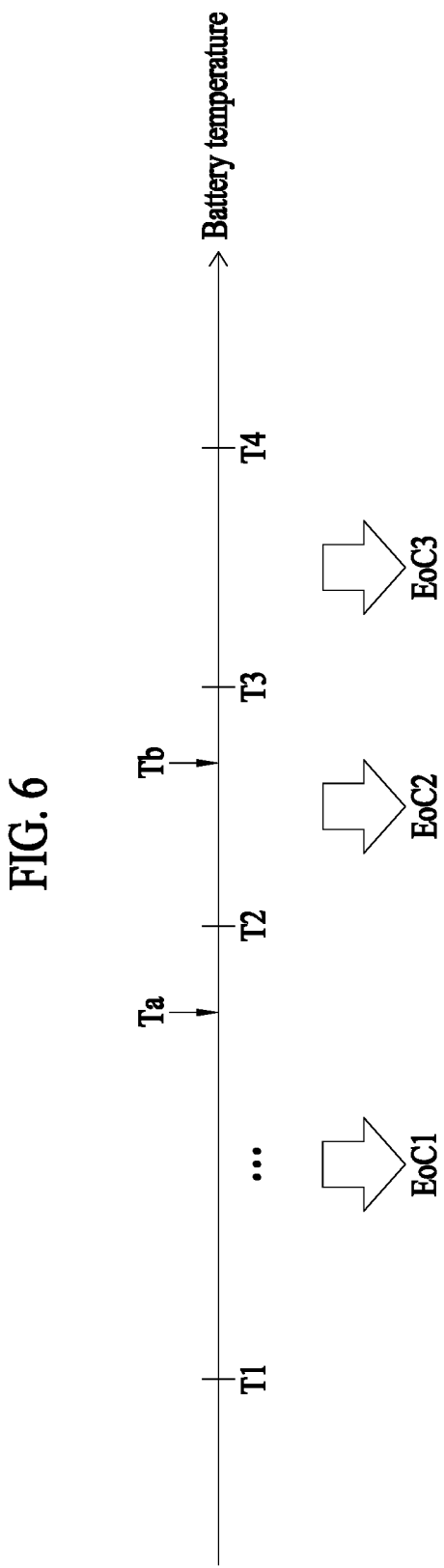

ELECTRONIC APPARATUS AND CHARGING CONTROL METHOD OF THE ELECTRONIC APPARATUS

CROSS-REFERENCE TO RELATED APPLICATION

Pursuant to 35 U.S.C. § 119(a), this application claims the benefit of earlier filing date and right of priority to PCT International Application No. PCT/KR2019/015287 filed on Nov. 11, 2019, the contents of which are hereby incorporated by reference herein in its entirety.

BACKGROUND OF THE INVENTION

1. Field of the Invention

This disclosure relates to an electronic apparatus and a charging control method of the electronic apparatus.

2. Discussion of the Related Art

Recently, with developments of digital technologies, various types of electronic devices such as a mobile communication terminal, a smartphone, a tablet personal computer (PC), a notebook, a personal digital assistant (PDA), a wearable device, or a digital camera are widely used. As more functions are provided by such electronic devices, interest in technology for charging a battery for supplying power to an electronic apparatus has increased.

SUMMARY OF THE INVENTION

In an electronic apparatus, repetitive charging and discharging of a battery can cause a swelling phenomenon of a battery pack. Accordingly, safety measures are required to prevent a safety accident such as fire or explosion.

An aspect provides an electronic apparatus and a method to efficiently control charging of a battery based on a change in temperature of the battery.

According to an aspect, there is provided an electronic apparatus including a battery, a charging module configured to charge the battery, at least one sensor, and a controller. The controller is configured to acquire state information of the battery using the at least one sensor, determine a charging condition of the battery based on the state information of the battery, and control the charging module to charge the battery based on the charging condition.

According to another aspect, there is also provided a charging control method of an electronic apparatus, the method including acquiring state information of a battery using at least one sensor, determining a charging condition of the battery based on the state information of the battery, and charging the battery based on the charging condition.

BRIEF DESCRIPTION OF THE DRAWINGS

The above and other aspects, features, and advantages of certain embodiments will be more apparent from the following detailed description taken in conjunction with the accompanying drawings, in which:

FIG. 6 is a diagram illustrating an end of charge (EoC) current based on a temperature of a battery of an electronic apparatus according to an example embodiment of the present disclosure.

DETAILED DESCRIPTION OF THE EMBODIMENTS

Figure 1:
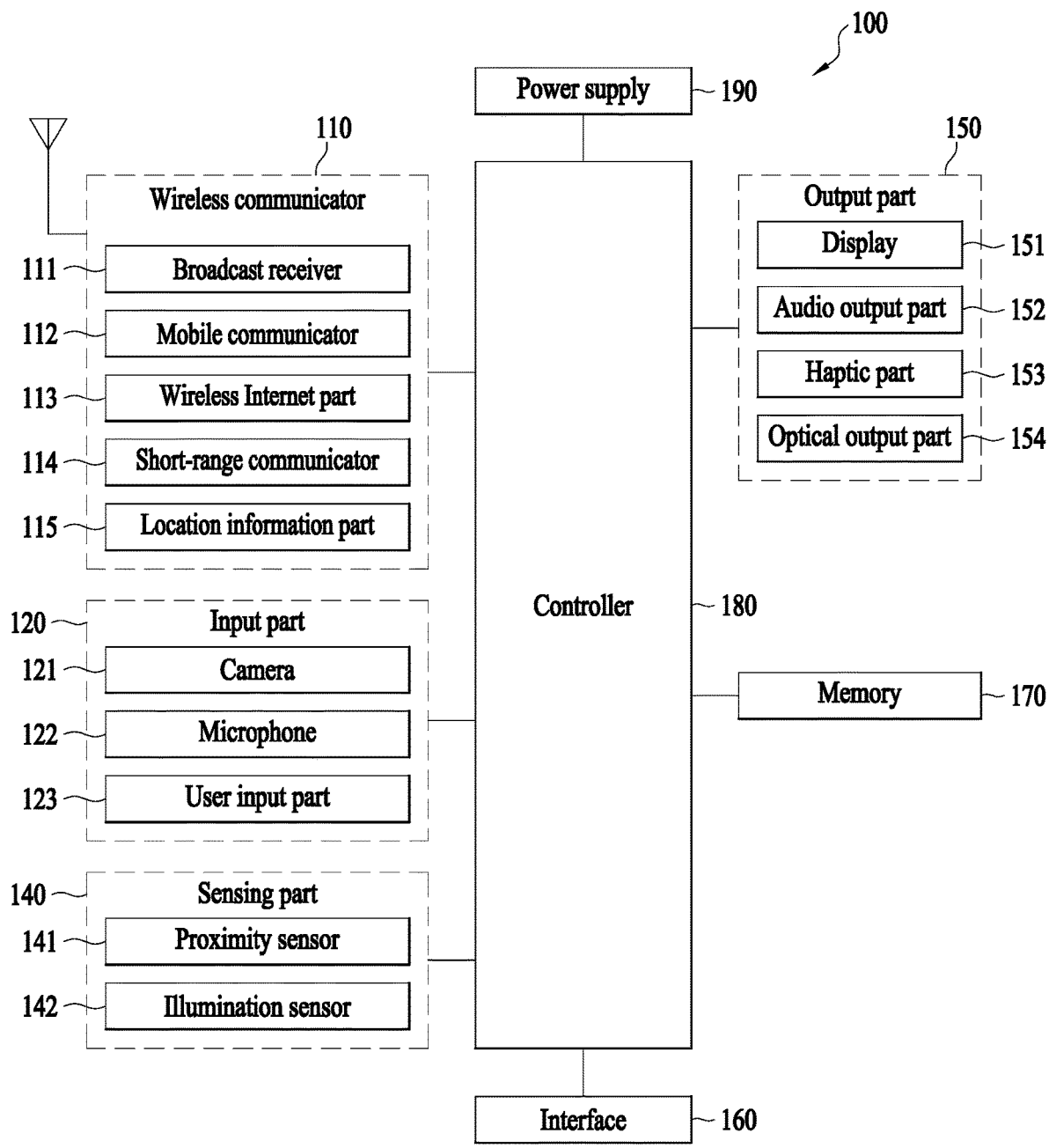
FIG. 1 is a block diagram illustrating an electronic apparatus according to various embodiments.

Hereinafter, preferred embodiments of the present disclosure will be described in detail with reference to the accompanying drawings, and the same or similar elements are designated with the same numeral references regardless of the numerals in the drawings and their redundant description will be omitted. A suffix "module" or "unit" used for constituent elements disclosed in the following description is merely intended for easy description of the specification, and the suffix itself does not give any special meaning or function. Also, it should be noted that the accompanying drawings are merely illustrated to easily explain the concept of the invention, and therefore, they should not be construed to limit the technological concept disclosed herein by the accompanying drawings.

The terms 'first', 'second', etc. may be used to describe various components, but the components are not limited by such terms. The terms are used only for the purpose of distinguishing one component from other components. When an arbitrary component is described as "being connected to" or "being linked to" another component, this should be understood to mean that still another component (s) may exist between them, although the arbitrary component may be directly connected to, or linked to, the corresponding other component. In contrast, when an arbitrary component is described as "being directly connected to" or "being directly linked to" another component, this should be understood to mean that no component exists between them.

A singular expression can include a plural expression as long as it does not have an apparently different meaning in context. In the present application, the terms "include" and "have" should be understood to be intended to designate that illustrated features, numbers, steps, operations, components, parts or combinations thereof exist and not to preclude the existence of one or more different features, numbers, steps, operations, components, parts or combinations thereof, or the possibility of the addition thereof.

An electronic device according to various embodiments may include at least one of a mobile phone, a smartphone, a laptop computer, a digital broadcasting terminal, personal digital assistants (PDA), a portable multimedia player (PMP), a navigator, a slate PC, a tablet PC, an ultrabook, a wearable device (e.g., smartwatch), a smart glass, a head-mounted display (HMD), a digital TV, a desktop computer, or a digital signage.

FIG. 1 is a block diagram illustrating an electronic apparatus according to various embodiments. Referring to FIG. 1, an electronic apparatus 100 may include at least one of a wireless communicator 110, an input part 120, a sensing part 140, an output part 150, an interface 160, a memory 170, a controller (or processor) 180, and a power supply 190. The electronic apparatus 100 may include other components in addition to the components of FIG. 1 and may also include some of the components of FIG. 1.

The wireless communicator 110 may include at least one module that enables wireless communication to be performed between the electronic apparatus 100 and a wireless communication system, between the electronic apparatus 100 and another electronic apparatus (e.g., the electronic apparatus 100), or between the electronic apparatus 100 and an external server. The wireless communicator 110 may include one or more modules that connect the electronic apparatus 100 to one or more networks. The wireless communicator 110 may include at least one of a broadcast receiver 111, a mobile communicator 112, a wireless internet part 113, a short-range communicator (NFC) 114, and a location information part 115.

The input part 120 may include at least one of an image input part (for example, a camera 121) that receives an image signal input, an audio input part (for example, a microphone 122) that receives an audio signal input, or a user input part 123 that receives a user input. For example, the user input part 123 can receive a user touch input through a touch sensor (or touch panel) provided in a display 151 or receive a user input through a mechanical key. Information collected in the input part 120 (for example, voice data and image data) can be analyzed and processed as a control command of a user.

The sensing part 140 may include one or more sensors to sense at least one of information in the electronic apparatus 100, surrounding environment information of the electronic apparatus 100, or user information. For example, the sensing part 140 may include at least one of a proximity sensor 141, an illumination sensor 142, a touch sensor, or a finger scan sensor. In addition, the sensing part 140 may include at least one of an acceleration sensor, a magnetic sensor, a gravity (G)-sensor, a gyroscope sensor, a motion sensor, an RGB sensor, an infrared (IR) sensor, an ultrasonic sensor, an optical sensor, a battery gauge (for example, a temperature sensor 230, a current sensor 240 in FIG. 2), an environment sensor (for example, a barometer, a hygrometer, a thermometer, a radioactivity sensor, a heat sensor, and a gas detection sensor), or a chemical sensor (for example, an electronic nose, a healthcare sensor, and a biometric sensor). In the present disclosure, the electronic apparatus 100 may use a combination of pieces of information sensed in at least two sensors among the aforementioned sensors.

The output part 150 can output information related to visual, auditory, or tactile. For example, the output part 150 may include at least one of the display 151, an audio output part 152, a haptic part 153, or an optical output part 154. In one example embodiment, the display 151 may form a layer structure or an integrated structure with a touch sensor to implement a touch screen that simultaneously provides a touch input function and a screen output function. For example, the touch screen can function as the user input part 123 that provides an input interface between the electronic apparatus 100 and a user and can function as the output part 150 that provides an output interface between the electronic apparatus 100 and the user.

The audio output part 152 can externally output audio data stored in the memory 170 or received from the wireless communicator 110 in a call signal reception, a call mode or a recording mode, a voice recognition mode, a broadcast reception mode, or the like. The audio output part 152 can output an acoustic signal associated with a function (for example, a call signal reception sound and a message reception sound) performed in the electronic apparatus 100. For example, the audio output part 152 may include at least one of a receiver, a speaker, or a buzzer.

The memory 170 can store data related to various functions of the electronic apparatus 100. For example, the memory 170 can store application programs (or applications) run in the electronic apparatus 100, data for operation of the electronic apparatus 100, and instructions. As an example, at least a portion of the application programs can be downloaded from an external server through wireless communication. As another example, at least a portion of the application programs can be previously stored in the memory 170 for a function (for example, call forwarding and outgoing function and message receiving and outgoing function) of the electronic apparatus 100. The application program stored in the memory 170 can be run to perform a predetermined operation (or function) of the electronic apparatus 100 based on the controller 180.

The controller 180 (e.g., processor) can control an overall operation of the electronic apparatus 100. For example, the controller 180 can process a signal, data, information, and the like input or output through components of the electronic apparatus 100 or run the application program stored in the memory 170, thereby providing information to a user or performing a predetermined function.

For example, to run the application program stored in the memory 170, the controller 180 can control at least a portion of the components of the electronic apparatus 100 of FIG. 1. To run the application program, the controller 180 can operate a combination of two or more components among the components included in the electronic apparatus 100.

The power supply 190 can supply power to each component included in the electronic apparatus 100 by receiving external or internal power based on a control of the controller 180. The power supply 190 may include a battery. The battery may include a built-in battery or a removable battery. For example, the power supply 190 can receive power from a battery (e.g., a battery 220 of FIG. 2). The battery may include a built-in battery or a removable battery.

The power supply 190 may include a power regulator that adjusts a voltage level or current level of the power. The power supply 190 can adjust the power to a voltage level or current level suitable for each component of the electronic apparatus 100 and provide the adjusted power to the corresponding component. At least some of the above-described components of the electronic apparatus 100 can cooperate with one another to implement an operation, a control, or a control method of the electronic apparatus 100 described herein. Also, the operation, the control, or the control method of the electronic apparatus 100 can be implemented through an execution of at least one application program stored in the memory 170.

Figure 2:
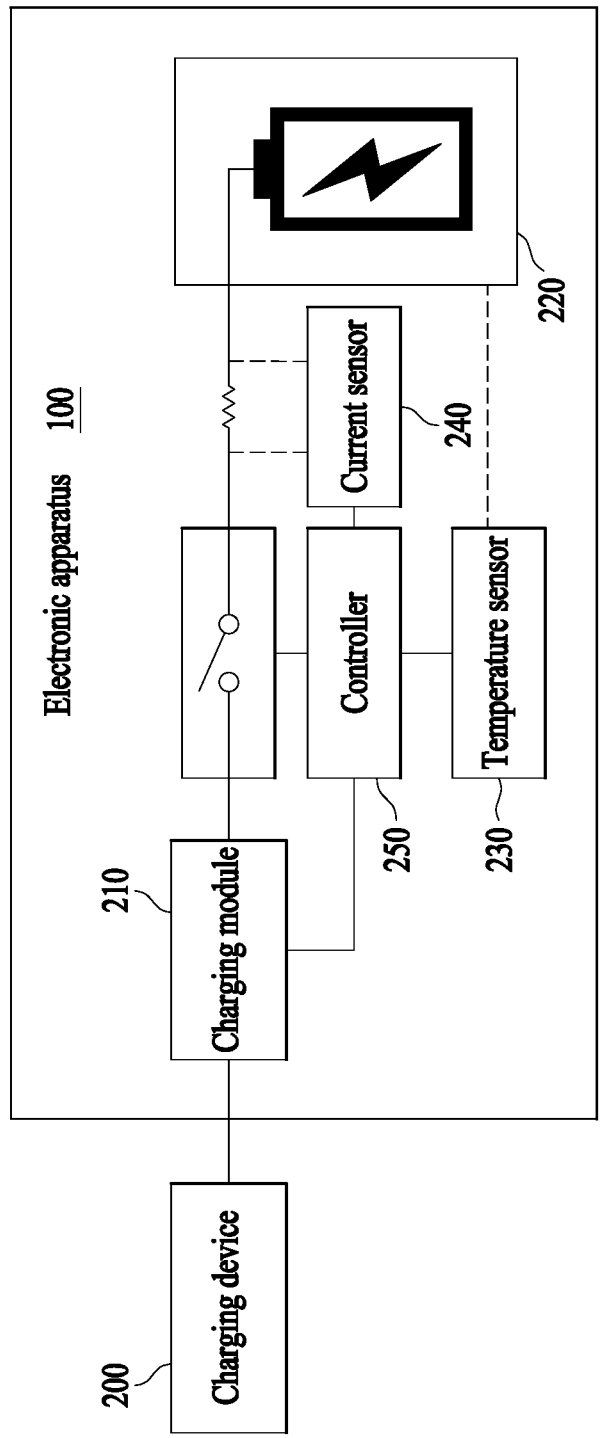
FIG. 2 is a block diagram illustrating a charging control method of an electronic apparatus according to an example embodiment of the present disclosure.

Next, FIG. 2 is a block diagram illustrating a charging control method of an electronic apparatus according to an example embodiment of the present disclosure. Referring to FIG. 2, the electronic apparatus 100 includes a charging module 210 and a battery 220.

The charging module 210 charges the battery 220 with power supplied from an external charging device 200. In more detail, the charging module 210 can select a charging scheme based on at least one of a type of the charging device 200, an amount of power to be supplied from the charging device 200, or a state of the battery 220. The charging module 210 can then charge the battery 220 based on the selected charging scheme. Further, the selecting of the charging scheme can be performed under a control of a controller 250, for example.

For example, the charging module 210 can control a charging voltage or a charging current to charge the battery 220 through either a fast charging or a normal speed charging. Also, the charging module 210 can charge the battery 220 through either a wired charging or a wireless charging based on a type of the charging device 200.

Further, the charging module 210 may include at least one of a wired charging module or a wireless charging module. As an example, the electronic apparatus 100 can be connected to the charging device 200 through a connecting port provided as an interface (e.g., the interface 160 of FIG. 1). The charging module 210 can charge the battery 220 using power supplied from the charging device 200 to which the charging module 210 is wired through the connecting port. As another example, the charging module 210 can wirelessly charge the battery 220 without using the connecting port. When the external charging device 200 is determined as a wireless power transmitting device, the electronic apparatus 100 can be supplied with power using at least one of an inductive coupling scheme based on a magnetic induction phenomenon or a magnetic resonance coupling scheme based on an electromagnetic resonance phenomenon, to charge the battery 220.

The electronic apparatus 100 may also include at least one sensor, for example, a battery gauge to acquire state information of the battery 220. For example, the electronic apparatus 100 can use a temperature sensor 230 and a current sensor 240 to acquire temperature information of the battery 220 and information on a current supplied to the battery 220. Further, the electronic apparatus 100 can use the at least one sensor to acquire state information associated with at least one of a capacity of the battery 220, a number of charging and discharging times, overcharging, over-discharging, cell-balancing, or whether swelling occurs.

In addition, the controller 250 (e.g., the controller 180 of FIG. 1) can acquire state information of the battery 220 by controlling the at least one sensor (e.g., the temperature sensor 230 and the current sensor 240). Also, the controller 250 can control the charging module 210 to charge the battery 220.

Figure 3:
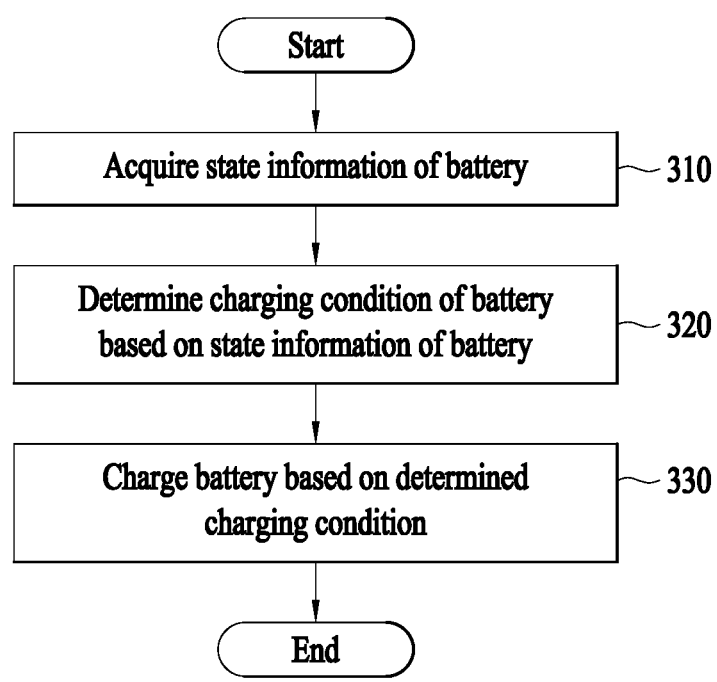
FIG. 3 is a flowchart illustrating a charging control method of an electronic apparatus according to an example embodiment of the present disclosure.

Next, FIG. 3 is a flowchart illustrating a charging control method of an electronic apparatus according to an example embodiment of the present disclosure. Referring to FIG. 3, in operation 310, the electronic apparatus 100 can acquire state information of the battery 220. In more detail, the controller 250 can use at least one sensor to acquire state information (e.g., temperature information of the battery 220 and charging current information of the battery 220) of the battery 220.

In operation 320, the controller 250 of the electronic apparatus 100 can determine a charging condition related to charging of the battery 220 based on the state information of the battery 220. For example, the charging condition may include a charging current (or charging voltage) condition of the battery 220 or an end of charge (EoC) current in the charging of the battery 220.

Based on the state information of the battery 220, the controller 250 can determine whether the battery 220 is charged through the fast charging or the normal speed charging, or determine a reference condition to terminate the charging of the battery 220.

In operation 330, the controller 250 can control the charging module 210 to charge the battery 220 based on the charging condition determined in operation 320. For example, the charging module 210 can adjust the power supplied from the external charging device 200 to a predetermined current level or voltage level under the control of the controller 250, to charge the battery 220. Also, the charging module 210 can terminate the charging of the battery 220 based on the charging condition determined by the controller 250.

Figure 4:
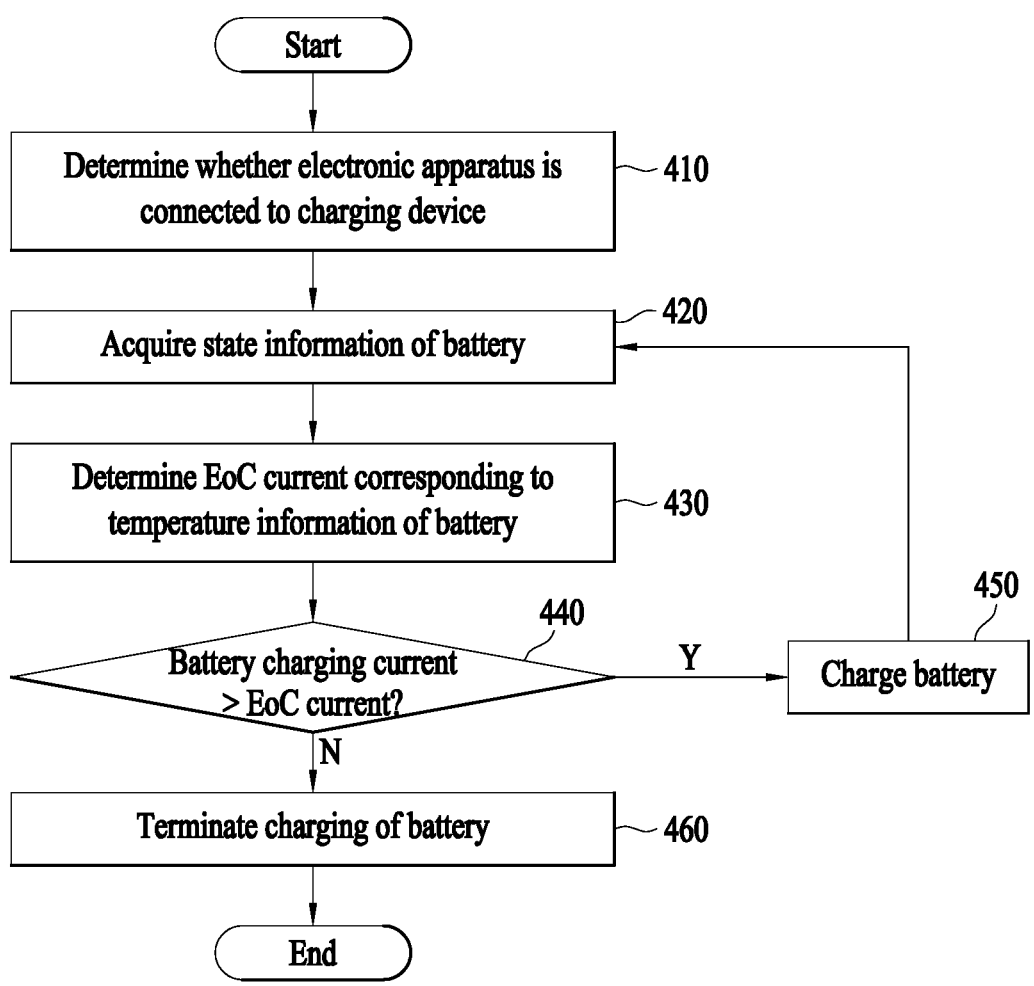
FIG. 4 is a flowchart illustrating a charging control method of an electronic apparatus according to an example embodiment of the present disclosure.

Next, FIG. 4 is a flowchart illustrating a charging control method of an electronic apparatus according to an example embodiment of the present disclosure. Referring to FIG. 4, in operation 410, the electronic apparatus 100 (e.g., the controller 250 of the electronic apparatus 100) can determine whether the electronic apparatus 100 is connected to a charging device (e.g., the charging device 200 of FIG. 2).

For example, the electronic apparatus 100 (e.g., the controller 250) can determine whether the electronic apparatus 100 is wired or wirelessly connected to the external charging device 200. In this example, the electronic apparatus 100 can identify a type of the charging device 200 and determine a charging scheme for the battery 220 based on the identified type of the charging device 200.

In operation 420, the electronic apparatus 100 (e.g., the controller 250) can acquire state information of the battery 220 when it is determined that the electronic apparatus 100 is connected with the charging device 200 in operation 410. In operation 430, the electronic apparatus 100 (e.g., the controller 250) can determine an EoC current of the battery 220 based on the state information of the battery 220.

In more detail, the controller 250 can acquire temperature information of the battery 220 using at least one sensor, for example, the temperature sensor 230. The controller 250 can then determine an EoC current value corresponding to the temperature information based on the acquired temperature information of the battery 220.

Further, the EoC current of the battery 220 can be set to have a value that increases according to an increase in temperature of the battery 220. For example, the electronic apparatus 100 can compare a (current) temperature of the battery 220 to a threshold temperature value stored in the memory 170 and determine an EoC current of the battery 220 based on a comparison result.

When the temperature of the battery 220 is less than or equal to a first designated value, the controller 250 can determine the EoC current of the battery 220 to be a first current value. Also, when the temperature of the battery 220 is greater than the first designated value, the controller 250 can determine the EoC current of the battery 220 to be a second current value, the second current value being greater than the first current value.

When the temperature of the battery 220 is less than or equal to a second designated value, and when the temperature of the battery 220 is greater than the first designated value, the controller 250 can determine the EoC current of the battery 220 to be the second current value. When the temperature of the battery 220 is greater than the second designated value, the controller 250 can determine the EoC current to be a third current value, the third current value being greater than the second current value.

In operation 440, the electronic apparatus 100 (e.g., the controller 250) can determine whether a magnitude of a current supplied to the battery 220, that is, a magnitude of a charging current of the battery 220 is greater than the EoC current of the battery 220, based on the state information of the battery 220. For example, the controller 250 can acquire information on a current supplied to the battery 220 using the current sensor 240.

When a magnitude of the current supplied to the battery 220 is greater than that of the EoC current, in operation 450, the controller 250 can control the charging module 210 to charge the battery 220. Also, when a magnitude of the current supplied to the battery 220 is less than or equal to the EoC current, in operation 460, the controller 250 can control the charging of the battery 220 to be terminated.

In operation 450, while the battery 220 is charged, the controller 250 can periodically acquire state information of the battery 220, and determine the EoC current of operation 430 again or determine whether to terminate the charging of the battery 220 based on the state information, for example, temperature information or charging current information of the battery 220.

Figure 5:
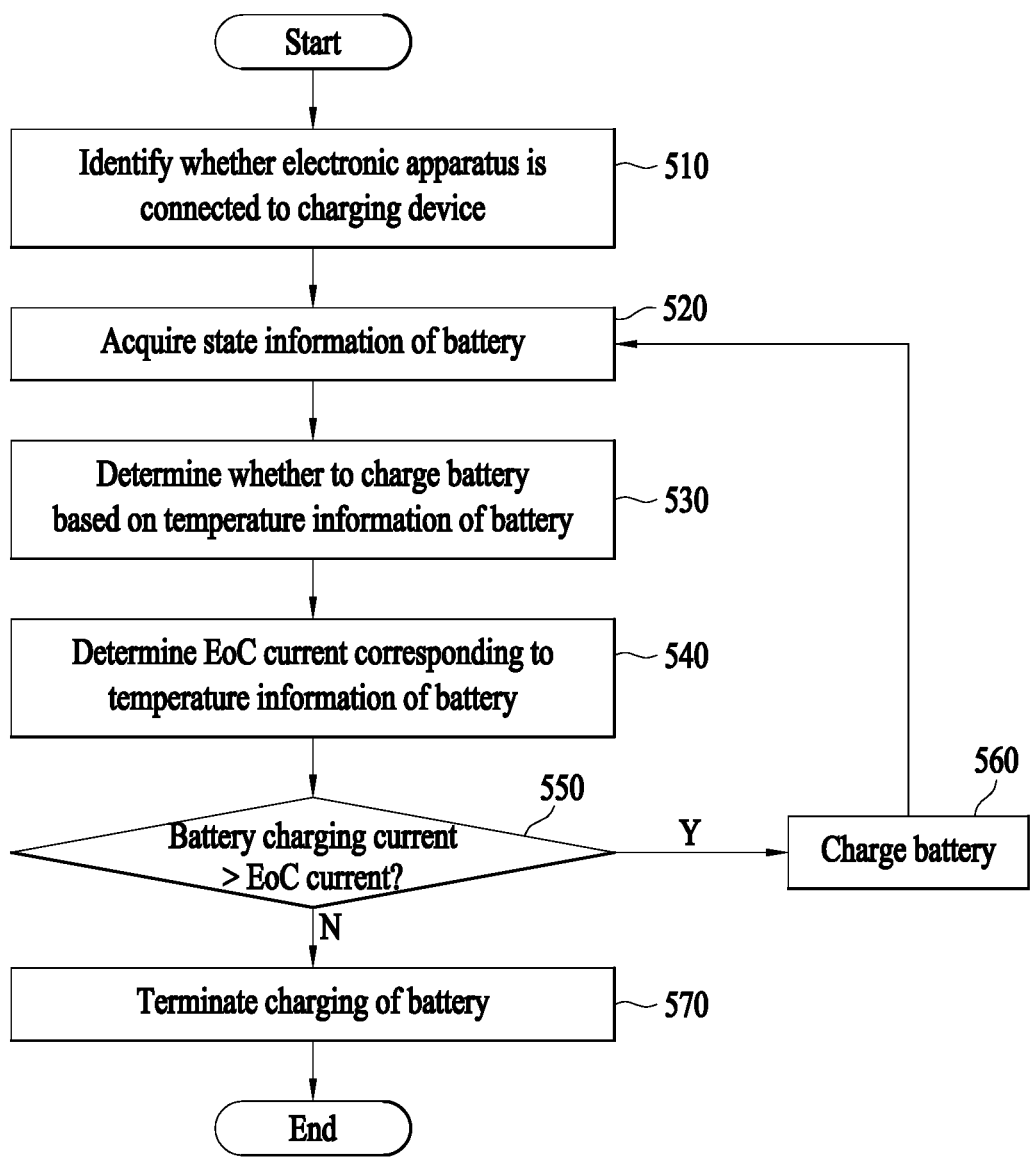
FIG. 5 is a flowchart illustrating a charging control method of an electronic apparatus according to an example embodiment of the present disclosure.

Next, FIG. 5 is a flowchart illustrating a charging control method of an electronic apparatus according to an example embodiment, and FIG. 6 is a diagram illustrating an EoC current based on a battery temperature range of an electronic apparatus according to an example embodiment. Referring to FIG. 5, the electronic apparatus 100 can charge the battery 220 under a control of the controller 250.

In operation 510, the controller 250 can identify whether the electronic apparatus 100 is connected to the external charging device 200. For example, the controller 250 can determine whether the charging device 200 is wired through a connecting port of the interface 160. Alternatively, the controller 250 can determine whether the charging device 200 is disposed adjacent to a wireless charging module to supply power.

In operation 520, when it is determined that the electronic apparatus 100 is connected with the charging device 200, the controller 250 can acquire state information of the battery 220 using at least one sensor to determine whether the battery 220 is to be charged and a charging scheme of the battery 220. For example, in operation 530, the controller 250 can determine whether to charge the battery 220 based on temperature information of the battery 220 acquired through the temperature sensor 230.

When a temperature of the battery 220 is within a predetermined range based on a preset criterion, the controller 250 can perform a next operation for charging the battery 220 using the charging module 210. Also, when the temperature of the battery 220 is out of the predetermined range, the controller 250 can control the battery 220 not to be charged.

For example, when the temperature of the battery 220 is less than a first reference temperature value (e.g., T1 of FIG. 6) or greater than a second reference temperature value (e.g., T4 of FIG. 6), the controller 250 can control the charging not to be performed to prevent overheating, swelling, or life reduction of the battery 220. When the temperature of the battery 220 is greater than or equal to the first reference temperature value and less than or equal to the second reference temperature value, in operation 540, the controller 250 can determine a charging condition of the battery 220.

In operation 540, the controller 250 can determine an EoC current of the battery 220 based on the temperature of the battery 220. For example, the controller 250 can divide the temperature range of the battery 220 into a predetermined number of sections based on a preset criterion and determine an EoC current corresponding to a section including the temperature of the battery 220 to be the EoC current of the battery 220.

When the temperature of the battery 220 corresponds to a first temperature range, the controller 250 can determine the EoC current of the battery 220 to be the first current value. When the temperature of the battery 220 corresponds to a second temperature range higher than the first temperature range, the controller 250 can determine the EoC current of the battery 220 to be the second current value greater than the first current value.

Referring to FIG. 6, the first temperature range may be greater than T1 and less than or equal to T2. Also, the second temperature range may be greater than T2 and less than or equal to T3. For example, the temperature of the battery 220 can be measured as Ta that belongs to the first temperature range. In this example, the controller 250 can determine the EoC current of the battery 220 to be EoC1 that is an EoC current corresponding to the first temperature range.

When it is determined that the temperature of the battery 220 is Tb and within the second temperature range, the controller 250 can determine the EoC current of the battery 220 to be EoC2 that is an EoC current corresponding to the second temperature range. Also, when the temperature of the battery 220 is within a third temperature range higher than the second temperature range, for example, when the temperature of the battery 220 is greater than T3 and less than or equal to T4, the controller 250 can determine the EoC current of the battery 220 to be EoC3 that is an EoC current corresponding to the third temperature range.

Meanwhile, like operation 530, when the temperature of the battery 220 is higher than the third temperature range (or lower than the first temperature range), for example, when the temperature of the battery 220 is greater than T4 (or less than T1), the controller 250 may not determine a separate EoC current and can control the charging of the battery 220 not to be performed.

In the electronic apparatus 100 according to embodiments, the temperature range and the EoC current corresponding to each temperature range are not limited to the classification method illustrated in FIG. 6. The electronic apparatus 100 can set the charging condition of the battery 220 based on an EoC current for each temperature section of various numbers and ranges.

In operation 550, when a charging current of the battery 220 has a value greater than that of the EoC current determined in operation 540, the controller 250 can perform the charging of the battery 220 in operation 560. When the charging current of the battery 220 has a value less than or equal to that of the EoC current, the controller 250 can terminate the charging of the battery 220 in operation 570.

While the battery 220 is charged in operation 560, the controller 250 can periodically acquire state information of the battery 220. The controller 250 can re-determine the EoC current of operation 540 or periodically determine whether the charging termination condition of operation 550 is satisfied, based on the periodically acquired state information of the battery 220.

Figure 7A:
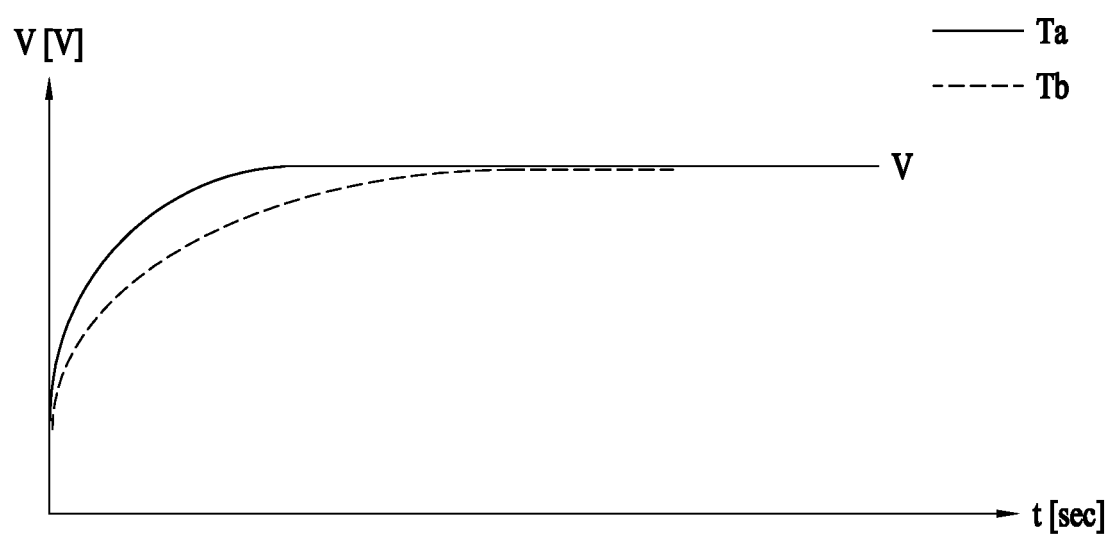
FIGS. 7A and 7B are graphs illustrating a battery charging situation of an electronic apparatus according to an example embodiment of the present disclosure.
Figure 7B:
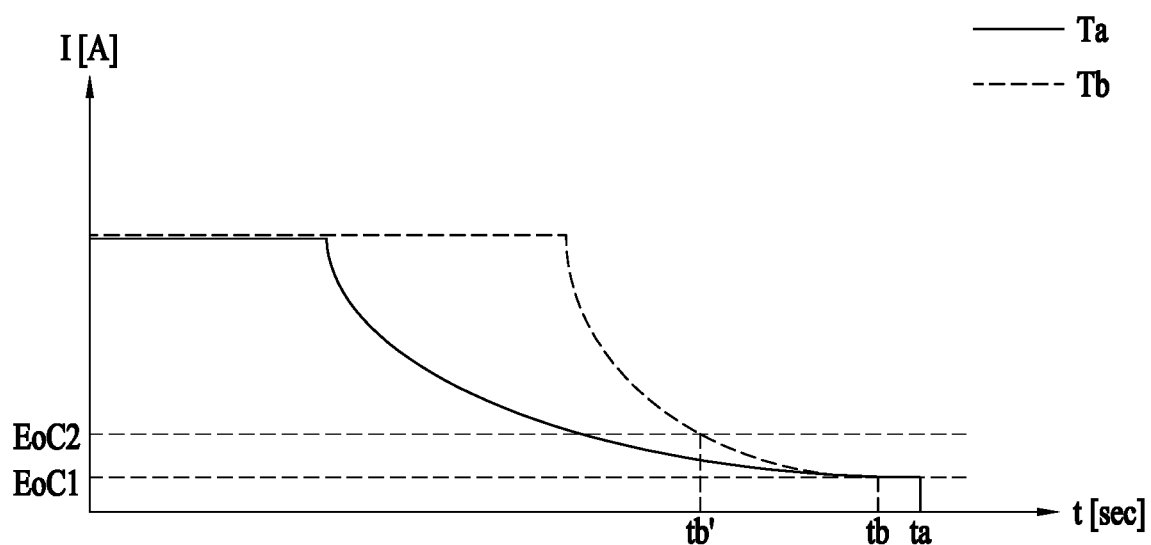

Next, FIGS. 7A and 7B are graphs illustrating a battery charging situation of an electronic apparatus according to an example embodiment. In particular, FIG. 7A is a graph representing a charging voltage of the battery 220 based on a charging time during charging of the battery 220 of the electronic apparatus 100, and FIG. 7B is a graph representing a charging current of the battery 220 based on the charging time during the charging of the battery 220 of the electronic apparatus 100 of FIG. 7A.

In FIGS. 7A and 7B, charging voltage and charging current graphs obtained when a temperature of the battery 220 is Ta are indicated by solid lines and charging voltage and charging current graphs obtained when the temperature of the battery 220 is Tb higher than Ta are indicated by dashed lines.

Referring to FIGS. 7A and 7B, in the electronic apparatus 100, the charging of the battery 220 can be performed such that a charging current is constantly maintained and a charging voltage increases with the lapse of the charging time for a predetermined time (e.g., a straight-line section of FIG. 7B) as a constant current (CC) interval. However, as the charging continues, the charging voltage of the battery 220 may not increase anymore. Thereafter, as a constant voltage (CV) interval, the charging of the battery 220 can be performed such that the charging current is gradually reduced with the lapse of the charging time.

When a magnitude of the charging current of the battery 220 is less than a magnitude of an EoC current, the controller 250 of the electronic apparatus 100 can terminate the charging of the battery 220. For example, when the temperature of the battery 220 is Ta that is a value (greater than T1 and less than or equal to T2) of the first temperature range of FIG. 6, the controller 250 can determine the EoC current to be EoC1. As shown in the solid-line graph of FIG. 7B, the charging current of the battery 220 can decrease to reach EoC1 in the CV interval as the charging time elapses. The controller 250 can terminate the charging of the battery 220 at a point in time ta at which the charging current reaches EoC1.

When the temperature of the battery 220 corresponds to Tb that is a value (greater than T2 and less than or equal to T3) of the second temperature range of FIG. 6, the controller 250 can determine the EoC current to be EoC2 greater than EoC1. In this instance, as shown in the dashed-line graph of FIG. 7B, the charging current of the battery 220 can be gradually reduced in the CV interval as the charging time elapses. The controller 250 can terminate the charging of the battery 220 at a point in time tb' at which the charging current reaches EoC2.

As a comparative example, when the electronic apparatus 100 performs charging at a constant EoC current (e.g., EoC1) irrespective of the temperature of the battery 220, the charging of the battery 220 having the temperature corresponding to Tb can be performed until a point in time tb at which the charging current reaches EoC1, and then terminated. According to example embodiments of the present disclosure, the electronic apparatus 100 can set an EoC current corresponding to a temperature of the battery 220, thereby preventing an overcharging of the battery 220 and minimizing a cell damage of the battery 220.

For example, when the battery 220 is charged under a high-temperature condition, a swelling phenomenon can easily occur in the battery 220 as the charging is repeated. Also, when the battery 220 is repetitively charged in an overcharged state caused by an EoC current set to be excessively high, the swelling phenomenon can easily occur as compared to a case in which the charging is terminated at a predetermined level of EoC current.

In embodiments of the present disclosure, when a battery is to be charged at a high temperature, an EoC current can be lowered to prevent an overcharging and minimize a battery swelling. Through this, a battery life can be maximized and a safety and a reliability of an electronic apparatus can be improved.

According to embodiments of the present disclosure, it is possible to provide an electronic apparatus that prevents an overcharging of a battery and a cell damage of the battery, thereby maximizing a battery life of the electronic apparatus. It is also possible to improve a safety and a reliability of an electronic apparatus by minimizing a battery swelling phenomenon and provide an efficient battery charging function.

Although exemplary embodiments of the present disclosure have been described for illustrative purposes, those skilled in the art will appreciate that various modifications, additions, and substitutions are possible, without departing from the essential characteristics of the disclosure. Therefore, exemplary embodiments of the present disclosure have been described for the sake of brevity and clarity. Accordingly, those skilled in the art will understand the scope of the disclosure is not limited by the explicitly described above embodiments but by the claims and equivalents thereof

What is claimed is:

1. An electronic apparatus comprising:
a battery;
a charging module;
at least one sensor; and
a controller configured to:
obtain a battery state information using the at least one sensor, the battery state information comprising a temperature of the battery;
determine an end of charge (EoC) current value of the battery based on the battery state information; and
control the charging module to charge the battery based on the EoC current value of the battery,
wherein the controller is configured to:
skip, in response that the temperature of the battery is outside a predetermined range, the determining of the EoC current value of the battery; and
determine, in response that the temperature of the battery is within the predetermined range.

2. The electronic apparatus of claim 1, wherein the controller is configured to:
control the charging module to terminate charging of the battery based on the EoC current value.

3. The electronic apparatus of claim 1, wherein, in a case in which the temperature of the battery is within the predetermined range, the controller is configured to:
set the EoC current value of the battery to be a first current value when the temperature of the battery is less than or equal to a first designated value; and
set the EoC current value of the battery to be a second current value greater than the first current value when the temperature of the battery is greater than the first designated value.

4. The electronic apparatus of claim 3, wherein, in the case in which the temperature of the battery is within the predetermined range, the controller is configured to:
set the EoC current value of the battery to be the second current value when the temperature of the battery is greater than the first designated value and less than or equal to the second designated value; and
set the EoC current value of the battery to be a third current value greater than the second current value when the temperature of the battery is greater than the second designated value.

5. The electronic apparatus of claim 1, wherein the controller is configured to:
detect a magnitude of a current supplied to the battery using the at least one sensor; and
control the charging module to terminate charging of the battery when the magnitude of the current supplied to the battery is less than or equal to the EoC current value.

6. The electronic apparatus of claim 1, wherein the controller is configured to:
control the at least one sensor to periodically obtain the battery state information; and re-determine the EoC current value of the battery based on the periodically obtained battery state information.

7. The electronic apparatus of claim 1, wherein, in the case in which the temperature of the battery is within the predetermined range, the controller is configured to:
   set the EoC current value of the battery to be a first current value when a temperature of the battery corresponds to a first temperature range; and
   set the EoC current value of the battery to be a second current value greater than the first current value when the temperature of the battery corresponds to a second temperature range higher than the first temperature range.

8. The electronic apparatus of claim 1, wherein the at least one sensor comprises at least one of a temperature sensor or a current sensor.

9. The electronic apparatus of claim 1, wherein the controller is configured to charge the battery using a wireless charging module or a wired charging module included in the charging module.

10. The electronic apparatus of claim 1, wherein the controller is configured to:
    control the charging module to terminate charging of the battery when the magnitude of the current supplied to the battery is less than or equal to the EoC current value.

11. The electronic apparatus of claim 1, wherein the controller is configured to:
    control the at least one sensor to periodically sense the temperature of the battery; and
    select another EoC current value of the battery based on the periodically sensed temperature.

12. A charging control method of an electronic apparatus, the method comprising:
    obtaining battery state information using at least one sensor, the battery state information comprising a temperature of the battery;
    determining an end of charge (EoC) current value of the battery based on the battery state information; and
    control a charging module to charge the battery based on the EoC current value of the battery,
    wherein determining of the charging condition of the battery comprises:
    skipping, in response that the temperature of the battery is outside a predetermined range, the determining of the EoC current value of the battery; and
    determining, in response that the temperature of the battery is within the predetermined range, the EoC current value of the battery corresponding to the temperature of the battery.

13. The charging control method of claim 12, wherein the battery state information further includes a magnitude of a current supplied to the battery, and
    wherein the controlling of the charging module to charge the battery comprises:
    controlling the charging module to terminate charging of the battery based on the EoC current value.

14. The charging control method of claim 12, wherein, in the case in which the temperature of the battery is within the predetermined range, the determining of the EoC current value of the battery comprises:
    set the EoC current value of the battery to be a first current value when a temperature of the battery corresponds to a first temperature range; and
    set the EoC current value of the battery to be a second current value greater than the first current value when the temperature of the battery corresponds to a second temperature range higher than the first temperature range.

15. The charging control method of claim 12, further comprising:
    control the charging module to terminate charging of the battery when the magnitude of a current supplied to the battery reaches the EoC current value.

* * * * *